United States Patent
Kahn et al.

[11] Patent Number: 5,519,278
[45] Date of Patent: May 21, 1996

[54] ACTUATORS WITH GRADED ACTIVITY

[75] Inventors: Manfred Kahn; Peter Matic; George C. Kirby, III, all of Alexandria, Va.

[73] Assignee: The United States of America as represented by the Secretary of the Navy, Washington, D.C.

[21] Appl. No.: 363,073

[22] Filed: Dec. 23, 1994

[51] Int. Cl.$^6$ .................................................. H01L 41/08
[52] U.S. Cl. .................................................. 310/326
[58] Field of Search .................................. 310/326, 346, 310/358, 330, 367

[56] References Cited

U.S. PATENT DOCUMENTS

| | | | |
|---|---|---|---|
| 2,841,722 | 7/1958 | Gravley | 310/330 |
| 2,911,370 | 11/1959 | Kulcsar | 252/62.9 |
| 3,947,708 | 3/1976 | Fulenwider | 310/330 |
| 4,190,785 | 2/1980 | Kompanek | 310/330 |
| 4,767,732 | 8/1988 | Furukawa et al. | 501/137 |
| 5,038,069 | 8/1991 | Lukasiewicz et al. | 310/338 |
| 5,139,689 | 8/1992 | Kitoh et al. | 252/62.9 |
| 5,170,089 | 12/1992 | Fulton | 310/328 |

FOREIGN PATENT DOCUMENTS 0214678  9/1991  Japan ........................... 310/358

*Primary Examiner*—Thomas M. Dougherty
*Attorney, Agent, or Firm*—Thomas E. McDonnell; George A. Kap

[57] ABSTRACT

A method for reducing and/or shifting stress in at least one outer end portion of an actuator made from a piezoelectric material. The actuator is affixed to a substrate by an adhesive bond and adapted to cycle between an expanded and contracted positions, which creates stresses in the actuator and in the bond. The method includes the step of doping at least one outer portion of the actuator with a metal oxide to reduce piezoelectric activity therein. In a preferred embodiment, the doped outer portion has a gradient composition varying from the maximum at the end of the actuator to essentially zero concentration at a point inward of the end. The system includes a doped piezoelectric actuator adhesively bonded to a substrate and electrodes attached to the actuator for receiving electrical energy, the actuator containing a metal oxide dopant in the outer portions thereof.

20 Claims, 4 Drawing Sheets

ACTUATORS WITH GRADED ACTIVITY

FIELD OF INVENTION

This invention pertains to the field of electromechanical actuators and more specifically, to the reduction and shifting of stress in actuators that are graded in activity and bonded to substrates.

BACKGROUND OF INVENTION

Linear electromechanical actuators can be bonded to substrates to control vibration, to position elements, to control noise and for many other functions. Normally, in vibration control applications, a linear actuator is bonded to a substrate and is cycled out of phase to counteract the vibrations induced in the substrate by an external force. During cycling with an alternating voltage, the actuator expands or contracts when voltage is at the peak of a cycle and contracts or expands when voltage is inverted to produce the desired stress which is transmitted to the substrate. In response to such an electric field, an actuator is capable of producing linear displacement of, for instance, about 10 microns in 10 microseconds. With one expansion and one contraction constituting one cycle, a typical linear piezoelectric actuator bonded to a substrate with a reliable epoxy adhesive is capable of undergoing about $10^4$ to $10^5$ cycles before failure.

The present practice in externally bonded linear actuators produces stress distributions that feature high stress concentrations at the opposite ends of the actuator and in the actuator-substrate bond. The stresses at the interface ends are the main source of actuator authority on the substrate. The stress concentrations that arise at the interface ends accelerate mechanical degradation, fatigue, debonding and fracture of the interface between the actuator and the substrate to which the actuator is bonded. Mechanical degradation, fatigue, debonding and fracture lead to loss of actuator authority, a shortened life of the bond between the actuator and the substrate, and failure of the structure comprising the actuator and substrate to operate as designed. Failure can occur in the bond or in the actuator.

Piezoelectric actuators of the type noted herein are typically rectangular and commonly have dimensions of about 1-4 cm by 1-4 cm with a thickness of about 0.01-0.5 cm.

SUMMARY OF INVENTION

It is an object of this invention to increase the life of the actuator-substrate bond by at least one order of magnitude.

It is another object of this invention to reduce and\or redistribute the stress concentration at the outer portion of the bond between the actuator and the substrate.

These and other objects of this invention are attained by doping with a dopant an outer portion of a linear electromechanical actuator to lower the electromechanical activity at its ends.

DETAILED DESCRIPTION OF INVENTION

This invention pertains to the redistribution of stress and reduction of stress concentrations in an electromechanical actuator bonded to a substrate and in the bond itself. This invention also pertains to a system comprising a linear actuator doped at outer portions thereof that is secured to a substrate by an adhesive bond. Such actuator goes through expansions and/or contractions which create stress concentrations in the actuator and in the bond bonding such an actuator to the substrate which stress concentrations are one-half or less than those in a uniform, i.e., homogeneous or undoped linear actuator under, otherwise, same conditions.

The peak stress concentrations that arise in a linear electromechanical actuator bonded to a substrate occur at outer portions of the actuator and are caused by uniform expansion and/or contraction of a homogeneous actuator that are induced by the imposition of a driving voltage on the actuator. By reducing the electomechanical activity of the linear actuator in the regions of peak stress concentration, such a stress concentration in the outer portions of the actuator can be substantially reduced and the cycling life of the actuator and the bond between the actuator and the substrate is expected to be increased by at least one order of magnitude.

Figure 1:
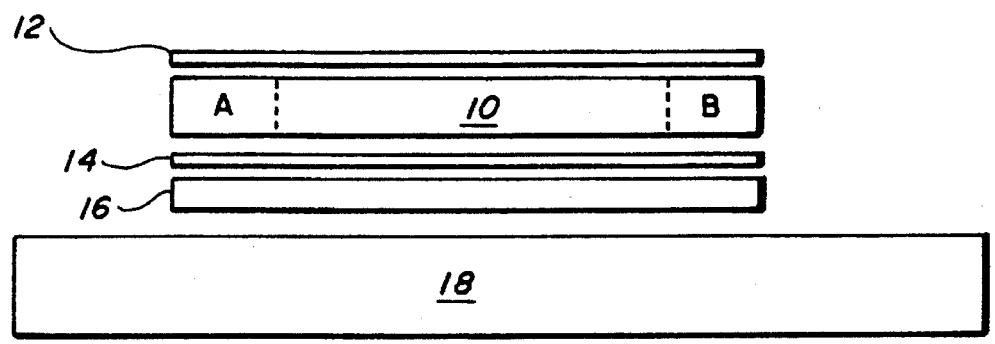
FIG. 1 is a schematic representation of a linear electromechanical actuator bonded to a substrate.
Figure 2:
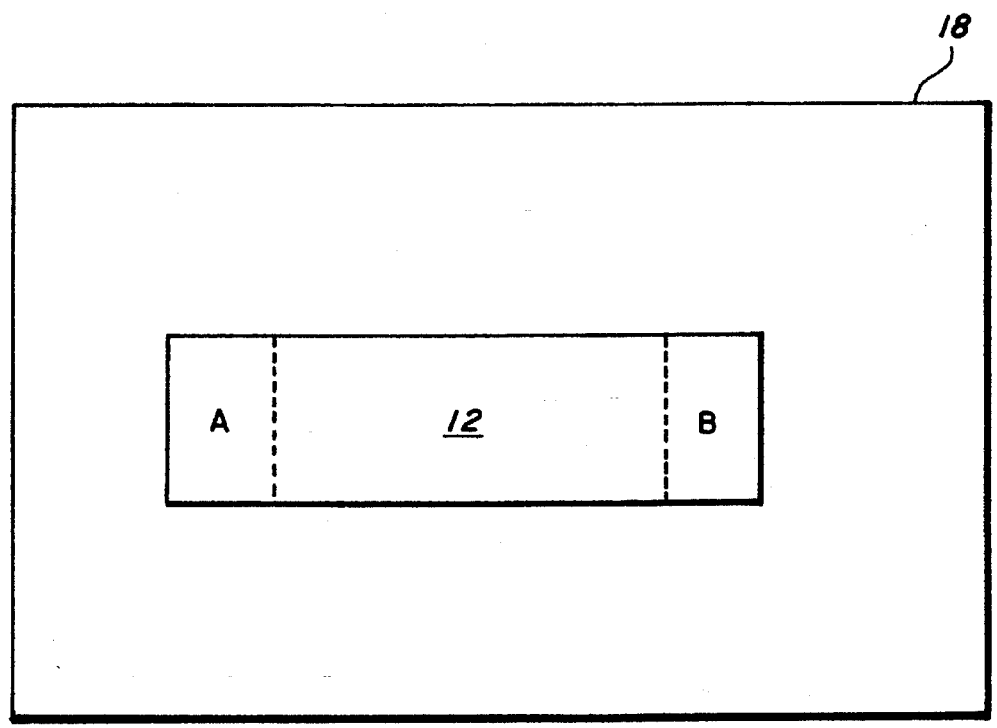
FIG. 2 is an elevation view of FIG. 1.
Figure 3:
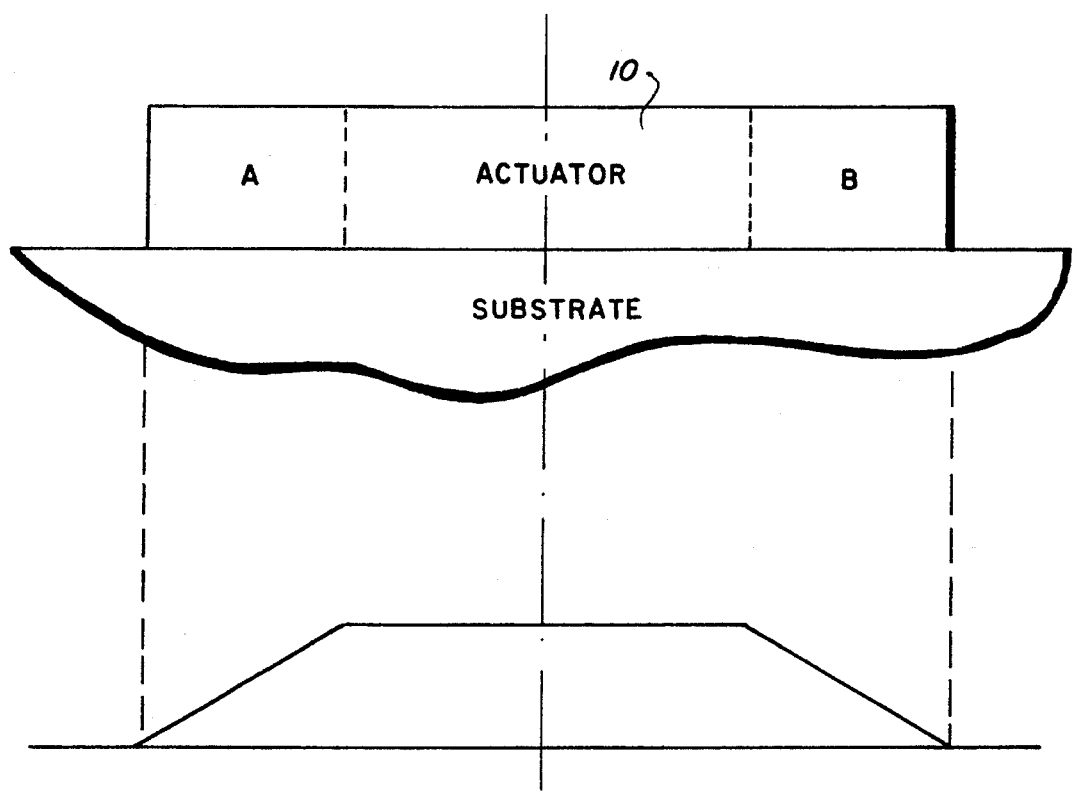
FIG. 3 is a schematic illustration of a doped electromechanical actuator bonded to a substrate that has a non-uniform longitudinal profile of the electromechanical actuation coefficients $d_{31}$ and $d_{33}$ in the actuator.

The system comprising an actuator doped at its outer portions and bonded to a substrate is generally illustrated in FIGS. 1 and 2. As shown in FIG. 1, the electromechanical actuator 10 has on its upper surface an upper electrode 12 which adheres to the actuator and is coextensive with the upper surface thereof. The lower electrode 14 adheres to the actuator and is coextensive with the lower surface thereof. Adhesive bond 16 secures the actuator, together with its electrodes, to substrate 18. The actuator is doped in the opposite outer portions A and B to reduce its electromechanical activity there. FIG. 3 illustrates non-uniform profile of $d_{31}$ in the doped outer portions A and B of actuator 10.

Although the dopant concentration is typically constant along a vertical plane in an actuator, it is possible to have a variable dopant concentration vertically. The outer portions of an actuator can be doped or the electromechanical activity can be varied along the vertical extent of an actuator.

One embodiment of the method for increasing the life of an actuator and of an actuator-substrate bond includes the steps of forming a linear actuator from a ceramic material which has electromechanical characteristics, doping at least the outer portions of the actuator with a material which lowers the electromechanical activity of the ceramic material from which the rest of the actuator is made, providing electrodes on the actuator for imparting an electrical field to the actuator which acts to expand or contract the actuator, and bonding the actuator to a substrate.

The step of forming a linear actuator can be accomplished in a mold by introducing a ceramic powder into the mold and compacting the powder to form a "green" actuator. The compacting pressure should be sufficient to produce a unitary actuator preform having high green strength. The compacting pressure in forming an actuator at about room temperature is typically in the range of 100–10,000 psi and more typically in the range of about 500–5,000 psi.

Compaction of the powder particles in a mold in making an actuator preform merely forces the powder particles together so that particles are only physically joined by the compaction force. The formed actuator has a density of below about 70% of the theoretical density of about 7 to 7.9 g/cc, more typically about 60%, and it is powdery and can be broken up manually.

After being formed in a mold, the actuator is removed from the mold and subjected to sintering in air at an elevated temperature. The principal object of the sintering procedure is to fuse or sinter the powder particles together and to develop the requisite density and crystal structure whereby the crystallites grow in size and the resulting actuator acquires the ability to change dimensions, after poling if the powder is piezoelectric, on application of a suitable electric field, which property the actuator does not have before the sintering procedure.

The sintering operation can be carried out by heating the actuator in air from room temperature slowly to an elevated temperature below about 1400° C., holding it at the elevated temperature for a period of time of less than about three hours and then slowly cooling it to about room temperature. In a preferred embodiment, the sintering operation can be carried out in air in a ceramic kiln by raising the temperature of the preform from about room temperature at a rate of about 2°–5° C./minute to an elevated temperature in the range of about 1150°–1350° C., holding the actuator at the elevated temperature for a period of about 15 minutes to about one half hour and then slowly cooling it to about room temperature by reducing the heating power and letting the actuator cool in a controlled manner. This cooling step takes several hours.

In order to preserve the lead content in the actuator during the sintering operation, when a lead-containing composition is used, the actuator is placed in a covered crucible and can be covered by a mixture of the lead-containing powder and at least one other material, such as zirconia ($ZrO_2$), and then the actuator can be sintered in the usual manner. Zirconia is believed to prevent the lead-containing powder from sticking to the actuator.

After sintering, the actuator has a developed crystal structure wherein the crystals are grown to about 5 microns and fused together. The actuator at this stage has density above 90% of the theoretical density of about 7.9 g/cc, typically about 92–98%, and particles thereof do not separate when the actuator is subjected to manual rubbing. When this actuator is made from piezoelectric ceramic, it does not have an overall piezoelectric effect until poled. However, individual particles in such an actuator have a piezoelectric effect whose net or overall piezoelectric effect is about nil since piezoelectric effect in the individual particles is directed in random directions and generally cancels out when considered overall.

The actuator sintered as described above, is electroded by providing on opposing surfaces thereof electrically conducting surfaces which function as electrodes. Although any electrically conductive material can be used as electrodes, preferred are nickel-chromium alloy, gold or silver. The electrodes can be provided by dispersing finely powdered electrode material in a liquid medium and then applying the metal dispersion onto opposing surfaces of the actuator. The actuator can then be placed in a drying oven and the electrode dispersion on the actuator surfaces is dried in a few minutes. After drying, the thickness of each electrode should be on the order of less than 100 microns.

The electroded actuator is then poled to develop the overall electromechanical effect by aligning dipole moments of the individual particles in the actuator to nearly one direction. Poling is generally carried out in a high dielectric strength liquid or gaseous medium at an elevated temperature by subjecting the electroded actuator to a high voltage for a period of time of less than two hours until sufficient alignment of the dipole moments is attained. The voltage is applied to the electrodes already provided on the actuator. Typically, poling of the piezoelectric actuator can be effected by subjecting the actuator, while disposed in the medium heated to 100°–150° C., to field in the range of 0.1–10 Kv/mm of the actuator thickness, more typically 1–5 Kv/mm, for about 5 minutes to about one-half hour. After poling, most of the dipole moments in the electroded actuator are aligned in nearly the general direction of the applied voltage.

Figure 4:
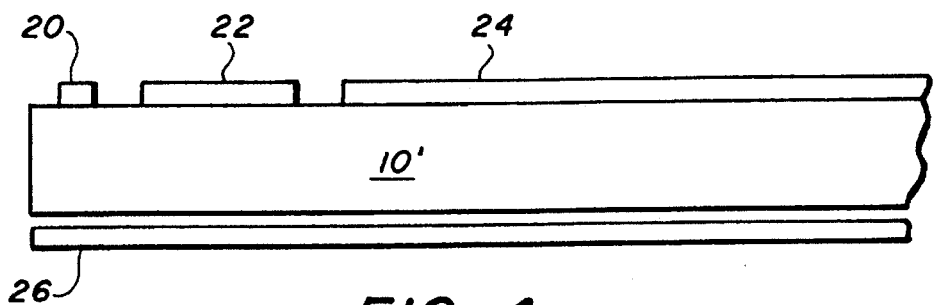
FIG. 4 is a schematic representation of an electromechanical actuator with segmented electrodes.
Figure 5:
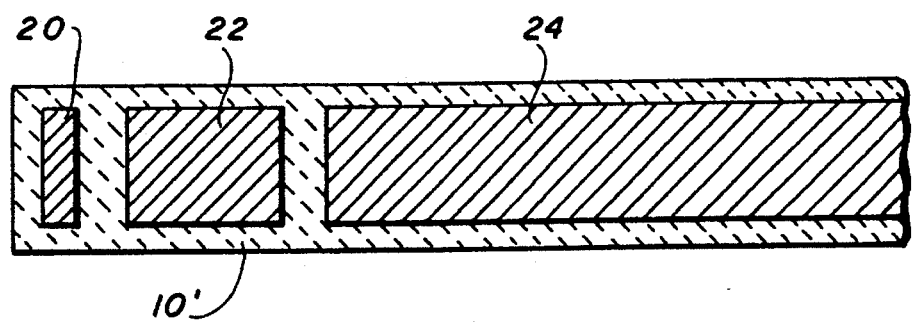
FIG. 5 is an elevation view of FIG. 4.

The actuator can also be poled through segmented electrodes to provide different degrees of dipole alignment in an actuator. Segmented electrodes 20, 22, 24 shown in FIGS. 4 and 5 can be provided on the upper surface of actuator 10' and a common electrode 26 can be provided on the lower surface of the actuator. Different degrees of dipole alignment can be provided in different regions of an actuator by imparting different voltages to electrodes 20, 22, and 24. The electromechanical strain can be reduced by applying a different voltage to at least one of the segmented electrodes.

The materials from which an actuator of this invention can be made are electromechanically active materials which change dimensions in response to an applied field. Typically, these can be made from ceramic powders having appropriate particle size, typically on the order of less than 1 micron. These powders can be obtained commercially. Suitable ceramic powders can be sintered into ceramic solids that have either electrostrictive or piezoelectric properties. In an electrostrictive material, which only expands on application of an electric field, the strain caused by an electric field is proportional to the square of the field whereas in a piezoelectric material, which expands and contracts on application of an electric field, the strain developed is at least initially linearly dependent upon the field. Piezoelectric material also develops polarization and an internal field when it is strained through an applied stress. An example of an electrostrictive material is PMN-PT, i.e., 0.9 Pb ($Mg_{1/3}$ $Nb_{2/3}$ $O_3$)–0.1 $PbTiO_3$. An example of a piezoelectric material is $PbZrTiO_3$.

Electrostrictive materials offer certain advantages over piezoelectric materials in actuator applications in that they do not contain domains and so return to their original dimensions when the applied field is reduced to zero. Electrostrictive materials also do not age significantly. However, the piezoelectric materials are preferred in the actuators disclosed herein since they offer more controllable preparation, better reproducibility and a wider temperature range of operation.

A number of different piezoelectric ceramics are commercially available to make an actuator of this invention. Such commercial piezoelectric ceramics can contain dopants in amounts ranging from a very small amount, i.e., a fraction of a percent, to a level where the dopant is a significant component in the composition, i.e., 10% or more. The dopant can be lanthanum, tin, niobium strontium or barium, and others which are added to the composition to affect a property. Doping relates to the introduction of dopants or additives. Doping can be achieved by adding an additive material when the initial ceramic powder is processed for forming, or by adding it to a formed body as a solution that wicks into it or by applying it to a sintered ceramic before an additional heat treating-diffusion step. Doping can be implemented uniformly throughout the whole ceramic body or topically, to selected regions only. Doping materials are selected for their effect on important properties of the final ceramic, i.e., its sinterability or the values of its cur temperature. In this invention, additional doping is used to lower the electromechanical activity of the parent actuator material.

The piezoelectric ceramic compositions suitable herein for making actuators have a piezoelectric coefficient $d_{33}$ that is in the approximate range of 50–500 pC/N, more typically 125–350 pC/N. The piezoelectric activities of such ceramic compositions can be reduced by adding to them, on the average, about 0.02–5% by weight, preferably about 0.5–3% by weight of an oxide dopant such as iron oxide, niobium pentoxide, zinc borate, lanthanum oxide, and magnesium oxide. Lanthanum oxide can be added to reduce the electromechanical activity of electrostrictive PMN dopant. Zinc borate is preferred since it depresses the piezoelectric effect significantly and it reduces the probability of cracking of the ceramic when the final actuator is made therewith. The amounts of the dopant are averages since if the concentration of the dopant here has a gradient, it is typically maximum at the end of the actuator and declines to nearly zero at some distance therefrom. It is possible to use other dopants or additives, such as metal powders, which reduce the electromechanical activity, providing the strain differential needed to modify the stress concentrations in the actuator and in the bond between the actuator and the substrate.

Dopants or additives are used here to modify the piezoelectric activity of a region in an actuator. The dopant should be non-uniformly distributed throughout that region since the principle objective of introducing the dopant into the ceramic composition of the actuator is to have an electromechanical activity gradient in the actuator after sintering. The manner of introducing the dopant into the ceramic composition of the actuator and the subsequent processing dictate how the dopant is distributed in the critical ceramic region to achieve objects of this invention.

The dopant can be admixed with the ceramic composition powder when the dopant is in powder form. The mixing time of the dopant and of the ceramic composition powders to obtain a uniform distribution of the dopant is on the order of one hour, depending on the size of the batch, mixing equipment used, etc.

However, the dopant can be incorporated into the ceramic composition in many ways. For instance, differently doped ceramic materials can be introduced into different regions of the mold, with materials for the outer regions of the actuator, for instance, containing a different type or amount of a dopant. Also, the dopant can be dissolved or dispersed in water that is then used to make a slurry containing the PZT composition powder. Alternatively, the dopant can be incorporated in the actuator by means of diffusion from a solid, a liquid or a gas. In this variation, the ceramic composition is first formed into an actuator and the dopant is then diffused thereinto by bringing a surface of the actuator in contact with the carrier containing the dopant and the dopant is then allowed to diffuse into the actuator. Diffusion in this manner can be implemented before or after high temperature sintering and can take several hours depending on the porosity of the actuator, the concentration of the dopant in the liquid or gas, temperature, pressure and other parameters. Diffusion of the dopant into the actuator can form a compositional gradient whereby concentration of the dopant in the actuator may be greater at any point closer to the point of dopant introduction than at any point further removed. Alternatively, extended diffusion times can result in uniform dopant distributions. The electrochemical activity of the actuator is then, likewise, modified by the presence of the dopant therein to have a gradient similar to that of the dopant concentration, since the dopant used herein causes the electromechanical activity to be inversely proportional to the dopant concentration.

If the dopant is to be introduced into the actuator by diffusion, such introduction can be effected before, during or after sintering. It is more advantageous to diffuse the dopant into the green ceramic actuator before sintering the same.

Since stress in an undoped linear actuator bonded to a substrate concentrates at the end or outer portions, doping of the actuator should be effected in the outer portions A and B, shown in FIG. 1, each of which covers a distance of about 10–80% of the distance from the end of the actuator inwardly towards the middle of the actuator.

In parallelogram actuators, such as rectangular or square actuators, or actuators of other geometric shapes, actuators having ratio of length to thickness in the range of about 10/1 to 100/1 and are disposed flat on a flat plane with their lengths disposed East and West and their widths disposed North and South with center-lines running North and South, the portions of the actuator that are typically doped are about 10–80% from the ends of the actuator, based on the distance from either end inwardly to the middle or the centerline of the actuaror. In a disc-shaped actuator, the doped portion is about 10–80% from the circumference of the actuator measured along a straight line to the center of the actuator. In a preferred embodiment, the doped portion is about 20–60% from an end of the actuator and the doped portion has gradient concentration where the dopant is maximum at the end of the actuator and gradually decreases to near 0% inwardly closer to the center or the middle of the actuator. It is estimated that over 80% of the stress concentration in an undoped actuator occurs in the outer portions of the actuator and it is necessary to dope these and surrounding regions in the manner described to reduce their electromechanical activity in order to reduce and/or redistribute stress concentrations in a driven actuator bonded to a substrate.

Figure 6:
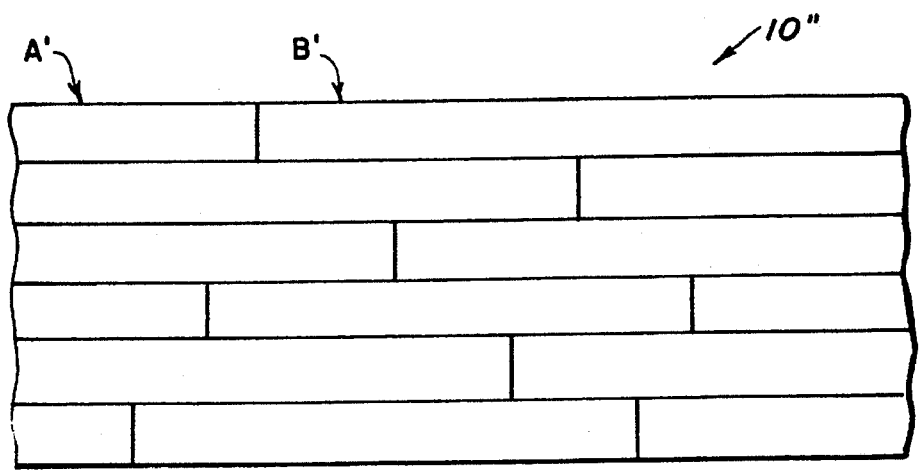
FIG. 6 is a schematic illustration of a electromechanical actuator made from a stack of laminated ceramic tapes.

As shown in FIG. 6, actuator 10" can also be made by laminating a plurality of stacked ceramic piezoelectric tapes. Actuator 10" is doped in outer portions A' and B'. The tapes of the actuator are positioned such that the ends thereof do not coincide with the ends of the other tapes in the actuator, especially the adjoining tapes. This arrangement gives a larger area for the tapes near the ends that have a lower electromechanical activity to bond to those that are in the centermost active region. The large bonding area gives more strength to the bond between the center and the ends.

The actuator is secured to the substrate by a suitable means. Typically, the actuator is adhesively secured to the substrate by means of a commercially available adhesive such as an epoxy adhesive.

Typically, a suitable commercially available adhesive is applied to the actuator and/or the substrate, as by brush or by spraying, and the actuator and the substrate are secured by fastening one to the other. When modeling a perfect bond between the actuator and the substrate, the adhesive thickness may be assumed to be zero, although perfect bonds do not exist when an epoxy adhesive is used.

The substrate to which the actuator is secured can be a metal or a nonmetal structure. It is typically metal. When an actuator is bonded to a substrate and the actuator is subjected to electromechanically induced expansions and/or contractions, the rigidity of the substrate affects the strains in the actuator that are transmitted to the bond and from the bond to the substrate to attempt to convey to the substrate the dimensional changes in the actuator. If the substrate is comparatively flexible, the stresses transmitted through the bond to the substrate will generate more deformation in the substrate. However, if the substrate is rigid, stresses transmitted through the bond to the substrate will generate less deformation in the substrate. When the substrate is of intermediate flexibility, intermediate deformation in the substrate is generated.

In the system disclosed herein, an electromechanical actuator is bonded to a substrate, the actuator contains an oxide dopant in the outer portions thereof in amount sufficient to reduce the electromechanical activity and the stress in these portions by at least one order of magnitude. The stress results in the actuator when voltage is induced by virtue of the fact that the substrate resists dimensional change induced the driven actuator. The dimensional changes of the actuator are produced by imposition of an electrical field on the actuator.

The invention having been generally described, the following example is given as a particular embodiment of the invention to demonstrate the practice and advantages thereof. It is understood that the example is given by way of illustration and is not intended to limit in any manner the specification or any claims that follow.

EXAMPLE

This example demonstrates a computer design analysis by finite element methods of stress concentrations at one outer portion of a hypothetical linear actuator measuring 3 cm long, 2 cm wide, with a thickness of 0.02 cm, made from PZT 5 piezoelectric material.

Figure 7:
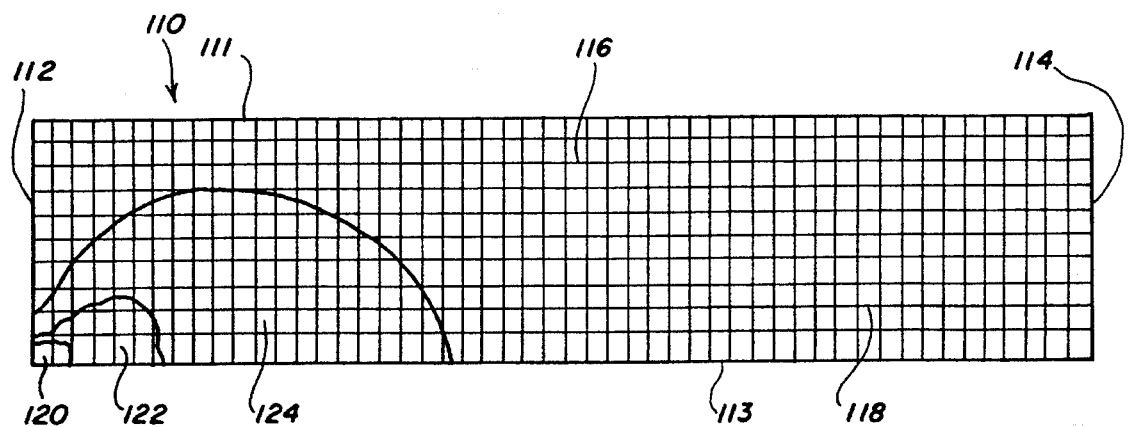
FIG. 7 illustrates the results of a finite element analysis that shows a cross-sectional view of one-half of a model of an undoped electromechanical actuator bonded with an infinitely thin bond to a substrate, with the substrate not shown.

FIG. 7 is a cross-sectional view taken along the length of one-half of a model of an undoped actuator, with one end of the actuator being to the left and the centerline of the actuator being to the right in the figure. The actuator model shown in FIG. 7 was evaluated as bonded to a substrate with an infinitely thin bond and voltage was applied to the upper and lower electrodes of the actuator.

Figure 8:
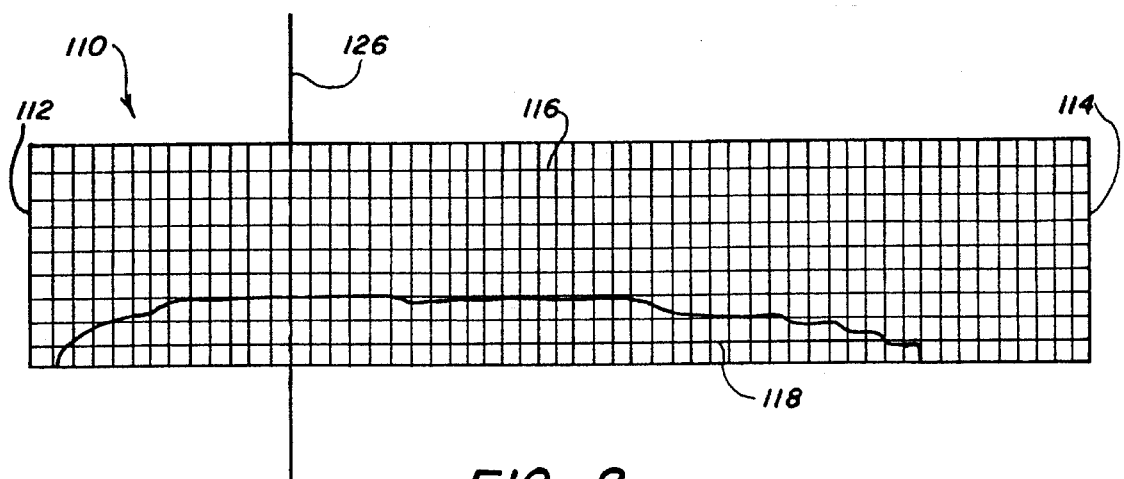
FIG. 8 shows the results of a finite element analysis of a cross-sectional view of one-half of a model of an electromechanical actuator, sections of which are doped with zinc borate that is bonded with an infinitely thin bond to a substrate, with the substrate not shown.

Each model square in FIGS. 7 and 8 is equivalent to 0.001 of the total actuator cross-sectional area.

FIG. 7 illustrates the cross-section of one-half of actuator model 110, with upper and lower electrodes 111, 113, which actuator is rectangular and is delineated by parallel spaced vertical and parallel planes 112, 114 and 116, 118. Plane 112 forms the outermost edge of the actuator and the centerline coincides with plane 114. Shear stresses arise in the actuator which are maximum in the outer portion of the actuator generally near the intersection of planes 112 and 118. The maximum stresses, which depend on the stiffness of the substrate, were about 7.50 psi disposed in region 120 and extended over about one square; the next highest stress region was about 5.00–6.25 psi, disposed in region 122, which is to the right and above region 120 towards the middle and the longitudinal center of the actuator and is in an area of about 12 model squares; and the region of lowest stress of about 2.50–3.75 psi was disposed in region 124, which is above and to the right of region 122. Region 124 occupies about 95 model squares.

FIG. 8 illustrates the concentration of shear stress near the left edge of an actuator model of the same dimensions as that in FIG. 7 with the exception that actuator model shown in FIG. 8 was doped at the left outer portion thereof whereas actuator of FIG. 7 was undoped. The actuator of FIG. 8 was assumed to be doped in the outer portion with about 2% of zinc borate along the vertical plane 112, corresponding to the left end of the actuator, and decreasing to about 0% along the vertical plane 126. The dopant concentration decreased inwardly horizontally but was constant in each vertical plane. From the left end of the actuator, which corresponds to the vertical plane 112, to the vertical plane 114, i.e., the actuator centerline is about 50% of the distance from plane 112 to plane 114, i.e., the actuator centerline, along the shortest straight line.

In the model of the doped actuator, one-half of which is shown in FIG. 8, the shear stress of about 7.50 psi acting in region 120 of the model of the undoped actuator of FIG. 7, are totally absent. In the model of the doped actuator of FIG. 8, the intermediate stress of about 5.00–6.25 psi acting in region 122 of the model of the undoped actuator of FIG. 7, are also totally absent. The only stresses remaining in the model of the doped actuator of FIG. 8 are the lowest stress of about 2.50–3.75 psi which now acts on the expanded area of about 104 model squares.

As is apparent from FIGS. 7 and 8, doping the actuator, and thereby reducing its piezoelectric coefficient in the region of high stress concentrations, has greatly reduced these stresses by having the stresses act over a much larger area and away from plane 126. Another very important factor is apparent from examinations of FIGS. 7 and 8: by doping the actuator in the outer portions A and B, the stresses were shifted to the right or inwardly into the actuator, away from the actuator end defined by plane 112. This shift to the interior of the actuator is desirable since the exterior corner is a more likely source of cracking.

The dimensions of the squares in FIGS. 7 and 8 are the same.

Shear stresses normal to the bond line along the left edge of the model of the undoped actuator of FIG. 7, not shown, were in the range of about 2.50–10.00 psi. These stresses acted on an area of about 7.5 model squares. These shear stresses were nearly absent after doping the actuator. This reduces the tendency for debonding to occur between the actuator-bond interface and the bond-substrate interface.

Many modifications and variations of the present invention are possible in light of the above teachings. It is, therefore, to be understood that within the scope of the appended claims, the invention may be practiced otherwise than as specifically described.

What is claimed:

1. A method for reducing stress in an electromechanical actuator affixed to a substrate by means of a bond, the actuator being subjected to dimensional change in response to energy input to the actuator, the dimensional change in the actuator causing stress therein and in its bond to the substrate, the method comprising the steps of:

a) decreasing the electromechanically induced strain in at least one outer portion of the actuator by doping at least the outer end portion of the actuator with a dopant to reduce electromechanical activity in the doped portion of the actuator, b) affixing the actuator to the substrate to transmit dimensional change from the actuator to the substrate through the bond, and c) imparting energy to the actuator to cause dimensional change therein.

2. The method of claim 1 wherein the doped region is in the outer portion of the actuator which extends from one end to about 10–80% of the distance from the end of the actuator to its middle.

3. The method of claim 2 wherein average concentration of the dopant in the doped outer portion is about 0.02–5% by weight.

4. The method of claim 3 wherein the dopant is selected from the group consisting of iron oxide, nickel oxide, niobium pentoxide, zinc borate, manganese oxide, lanthanum oxide, and mixtures thereof.

5. The method of claim 3 wherein the doped outer portion extends from an outer end to about 20–50% of the distance from the end to the middle of the actuator, wherein average concentration of the dopant in the doped outer portion is about 0.5–3% by weight.

6. The method of claim 3 wherein the step of doping is accomplished by diffusion doping, whereby the concentration of the dopant is greater at the outer portion of the actuator than at the middle thereof.

7. The method of claim 4 wherein said step of affixing the actuator to the substrate is accomplished by adhesively bonding the actuator to the substrate with an epoxy adhesive, and the step of imparting energy to the actuator is accomplished by imposing a voltage across the actuator.

8. A method for increasing life of a bond wherein a piezoelectric actuator that is bonded to a substrate and is caused to repeatedly expand and/or contract in response to input of energy, which repeated expansions and contractions cause eventual failure of the bond, the method comprising the steps of a) doping at least one outer portion of the actuator with a suitable dopant to reduce piezoelectric activity in the doped outer portion of the actuator;

b) bonding with an adhesive the actuator and the substrate in a manner to transmit the expansions and/or contractions from the actuator to the substrate; and c) imparting energy to the actuator to cause the expansions and/or contractions.

9. The method of claim 8 wherein the doped region extends from the end of the actuator for a distance of about 10–80% measured from the end of the actuator inwardly to its middle.

10. The method of claim 9 wherein the average concentration of the dopant in the outer portion containing the dopant is about 0.02–5% by weight.

11. The method of claim 10 wherein the step of doping is accomplished by diffusion doping whereby the concentration of the dopant is greater at the end than the inner portion of the actuator.

12. The method of claim 10 wherein the dopant is selected from the group consisting of iron oxide, nickel oxide, niobium pentoxide, zinc borate, manganese oxide, lanthanum oxide, and mixtures thereof.

13. The method of claim 8 wherein the step of doping is accomplished by using different powders in different regions of a mold in order to produce an actuator having a lower piezoelectric activity in at least one outer portion of the actuator.

14. An assembly comprising an electromechanical actuator, an adhesive bond, and a substrate wherein said actuator is secured to said substrate by said adhesive bond, at least one outer portion adjacent an end of said actuator contains a dopant by which electromechanical activity is reduced compared to a region of said actuator which is devoid of said dopant.

15. An assembly of claim 14 wherein the concentration of the dopant in the outer portion of the actuator containing the dopant declines from the end of said actuator inwardly; said dopant is selected from the group consisting of metal oxides; said outer portion extends for a distance of about 10–80% measured from the end to the middle of said actuator; and the concentration of said dopant in said outer portion is sufficient to reduce the stresses in said actuator by at least one-half compared to the stresses in an undoped actuator.

16. The assembly of claim 14 wherein the average concentration of said dopant in said outer portion is about 0.02–5% by weight, and the life of said bond, measured in terms of numbers of cycles between expansions and contractions of said actuator, is increased by at least one order of magnitude compared to that of an undoped actuator.

17. The assembly of claim 16 wherein said actuator comprises a plurality of ceramic tapes laminated one on top of each other.

18. The assembly of claim 16 wherein said actuator is made from a piezoelectric material and said dopant is selected from the group consisting of iron oxide, nickel oxide, niobium pentoxide, zinc borate, manganese oxide, lanthanum oxide, and mixtures thereof.

19. The assembly of claim 18 wherein said outer portion extends for a distance of about 20–50% from the end to the middle of said actuator.

20. The assembly of claim 18 which includes means for delivering alternating electrical energy to said actuator to cause it to repeatedly change dimensions and wherein said dopant in the ceramic is zinc borate.

* * * * *